(12) United States Patent
Li et al.

(10) Patent No.: US 7,582,509 B2
(45) Date of Patent: Sep. 1, 2009

(54) MICRO-EMBOSSING FABRICATION OF ELECTRONIC DEVICES

(75) Inventors: Shunpu Li, Cambridgeshire (GB); Christopher Newsome, Cambridgeshire (GB); David Russell, Cambridgeshire (GB); Thomas Kugler, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 356 days.

(21) Appl. No.: 11/453,974

(22) Filed: Jun. 16, 2006

(65) Prior Publication Data
US 2006/0290021 A1    Dec. 28, 2006

(30) Foreign Application Priority Data
Jun. 21, 2005    (GB) ................. 0512641.2

(51) Int. Cl.
*H01L 21/84* (2006.01)
(52) U.S. Cl. ................. 438/99; 438/151; 257/E21.561
(58) Field of Classification Search ............... 438/99, 438/151–166, 30; 257/E21.561
See application file for complete search history.

(56) References Cited
U.S. PATENT DOCUMENTS
6,764,885 B2 * 7/2004 Huang et al. ............... 438/161

2004/0063267 A1    4/2004 Bernds et al.

FOREIGN PATENT DOCUMENTS
| KR | A 2003-0071762 | 9/2003 |
| KR | A 10-2005-0003445 | 1/2005 |
| WO | WO 02/29912 A1 | 4/2002 |
| WO | WO 03/095175 A2 | 11/2003 |
| WO | WO 2004/055919 A3 | 7/2004 |

OTHER PUBLICATIONS

Stutzmann, N., et al. "Self-Aligned, Vertical-Channel, Polymer Field-Effect Transistors". *Science*, vol. 299, pp. 1881-1884, Mar. 21, 2003.

* cited by examiner

*Primary Examiner*—Richard A. Booth
(74) *Attorney, Agent, or Firm*—Oliff & Berridge, PLC

(57) ABSTRACT

A method of forming an electronic device on a substrate 10, comprising: embossing the substrate 10, surface treating the substrate so that unindented portions 11 repel a solution of a first material 60, and depositing a solution of the first material 60 in indentations 12 on the substrate 10 formed by the embossing. The substrate is then annealed so that level of the first material is the same as the surface of the substrate. The first material 60 in the indentations can then, for example, be used as the source and drain in the subsequent formation of a TFT.

31 Claims, 4 Drawing Sheets

Fig.1(III).
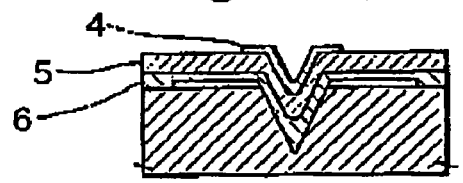

MICRO-EMBOSSING FABRICATION OF ELECTRONIC DEVICES

The present invention relates to fabricating electronic devices by embossing a substrate and depositing materials on substrate to form the devices. The present invention includes forming thin film transistors (TFTs).

A significant limitation to the realisation of advanced electronic devices is the lack of simple and low-cost high resolution patterning techniques. Conventional optical lithography has been extensively used for device fabrication. While photolithography allows for high resolution patterning, the alignment of the photomask to previously defined structures on the substrate can be difficult and dramatically increase production costs.

Other techniques, such as nanoimprinting and soft-contact printing appear promising for high resolution patterning. However, the alignment that is required in order to build up multilayered structures is even more challenging than that required for photolithography techniques. Similarly, ink-jet printing is a prospective technique for fabricating electronics on a highly productive level. However, its application is still restricted by printing resolution—currently several tens of microns.

It is well known that, compared with Si, GaAs etc inorganic semiconductors, an identified advantage of polymer electronics is easy fabrication due to the ability to use solutions of material during the manufacturing process. However, roll-to-roll process development is crucial for the effective further development of the polymer electronics industry. Roll-to-roll micro-embossing is a relatively new technique which can provide structures with resolution from submicrons to several tens of microns. As an example, micro-embossing has to date been applied to plastic substrates comprising a layer of material that is to be embossed coated with a conductive layer as an electrode. The indentations in the embossed layer are filled with electrophoretic material and the substrates are then covered with a further layer of conductive material as a counter-electrode to form an electrophoretic display (EPD) device.

A combination of pre-patterning and inkjet printing to produce a thin film transistor is described in *Self-Aligned, Vertical-Channel, Polymer Field-Effect Transistors* by Stutzman, Friend and Sirringhaus in Science, vol 299, 21 Mar. 2003. As shown in FIG. 1(I), an electrically conducting layer 2 is formed on a substrate 3. Subsequently, the substrate is embossed as shown in FIG. 1 (II) using a master 1 with sharp protruding edges. The top layer is microcut leading to defined source and drain electrodes. The channel length L of the eventual TFT is twice the length of one side of an indentation caused by the embossing. In step (III) the TFT is completed by depositing a semiconducting layer 6, a gate insulating layer 5 and a gate electrode 4.

This arrangement has a number of problems. First, it is difficult to fabricate arbitrary geometry of integrated electronic circuits. In addition, the step of embossing through the conducting layer 2 to form the source and drain electrodes causes problems in reproducibility. In particular, it is difficult to ensure that there is a sufficient, consistent connection of the semiconducting layer at the sharp edges of the source and drain electrodes. A further problem is to ensure that the film of conductive material 2 is embossed in the correct location, so problems in alignment remain. The step of cutting through the conducting layer 2 may also cause lifting of and other damage to the remaining source and drain electrodes, and it is difficult to remove all conductive material 2 from the channel region with certainty and thereby manufacture channels with consistent reproducible characteristics.

Thus, there are several problems in providing an effective combination of the pre-patterning and inkjet deposition methods. One major problem with this combination is providing sufficiently small device dimensions.

It would be desirable to emboss the substrate prior to providing the source and drain electrodes. However, as shown in FIG. 2, this leads to considerable problems. In particular, FIG. 2 shows an embossed substrate 100 with indentations 102 in its surface 101. An attempt has been made to deposit a solution of conductive material on the surface 101. However, the droplet of solution 110 has not reached the edge of the indentation 102 in which the channel material is to be deposited. In contrast, the droplet of solution 112 has flowed over the edge of the indentation. Thus, it is difficult to form TFTs with reproducible channel characteristics by this method.

According to a first aspect of the present invention, there is provided method of forming an electronic device on a substrate, comprising:

embossing the substrate;

depositing a solution of a first material in indentations on the substrate formed by the embossing; and annealing the substrate.

According to a second aspect of the present invention, there is provided a method of forming an electronic device on a substrate, comprising:

embossing the substrate;

surface treating the substrate so that unindented portions of the substrate are hydrophilic or hydrophobic; and depositing a solution of a first material in indentations on the substrate formed by the embossing, the solution being repelled by the surface treated portions of the substrate.

The present invention will now be described by way of example only, with reference to the following drawings, in which.

The present invention addresses major problems in connection with the fabrication of organic devices on large area flexible or rigid substrates.

The surface treatment of structured samples to provide a surface with differentiated relatively hydrophobic and hydrophilic regions is known (for example, by applying self-assembled monolayers (SAMs) by soft contact printing). However, it has not previously been known how to provide a high aspect ratio to obtain high quality of SAM application while maintaining a minimised topography to build up further layers of devices.

Figure 2:
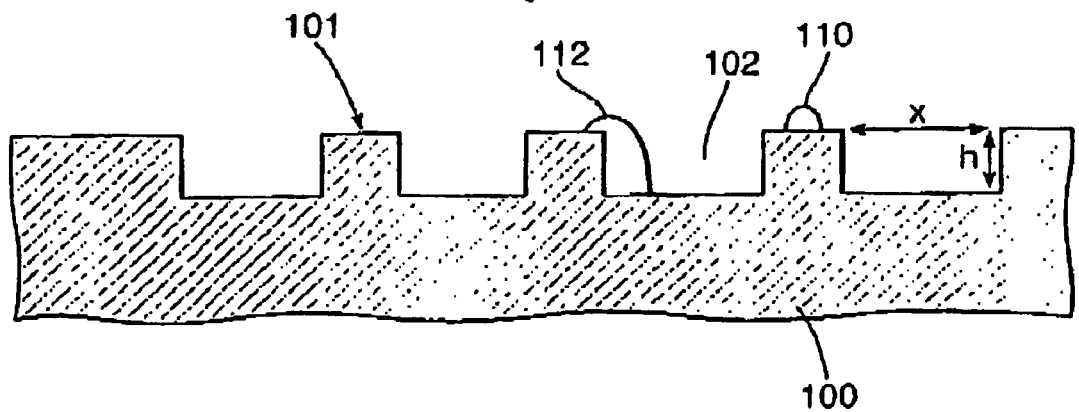
FIG. 2 shows an embossed substrate with conductive material deposited on it.

With this invention, the inventors have established a way to achieve this purpose. This preferably involves the embossing having a high contrast ratio—that is, the depth h of the indentations being high compared with their width x (see FIG. 2). In particular, if the contrast ratio is low, it is difficult to treat only the surface 101 to be hydrophobic while leaving the indentation 102 untreated.

The ratio required in order to obtain proper application of a SAM using a stump depends on the mechanical properties of the stump. Preferably, however, the ratio is larger than 1/50 (so for a one micron deep indentation the indentation length is preferably less than 50 microns).

Figure 1I:
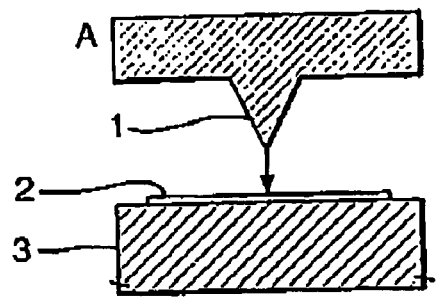
FIG. 1 shows a prior art method of manufacturing a thin film transistor.
Figure 1:
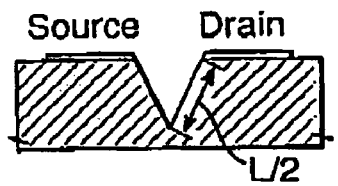

A further difficulty is that a high contrast ratio in the device of FIG. 1 would lead to a non-uniformity of subsequently deposited semiconductor and dielectric layers. This would make the consistent connection of the semiconductor more difficult and degrade the insulation properties of a dielectric layer along the edge of the source and drain electrodes. Consequently, the device qualities would be substantially downgraded.

However, the inventors have further recognised that the deformation of a flexible substrate that is induced by micro-embossing can be recovered by subsequent annealing. Thus, the high aspect ratio of an embossed substrate, which is necessary for surface treatment to obtain a wetting contrast, can be removed. This is beneficial for the definition of layers of devices deposited later.

Preferably, micro-embossing is carried out at a predetermined embossing pressure and embossing temperature $T_e$ that is much lower than the melting temperature of the substrate, which can be close to its glass transition temperature $T_g$. The embossing pressure and embossing temperature $T_e$ will be determined by the characteristics of the substrate, the characteristics of the master used for embossing and the desired contrast ratio. A resultant high contrast ratio allows the unembossed portions of the surface to be treated, preferably by applying a hydrophobic/lyophobic self-assembled monolayer (SAM) to them depending on the solvent used for subsequently deposited materials.

Other materials can then be deposited by inkjet printing in the hydrophilic/lyophobic or untreated indentations where the SAM is not applied. After inkjet printing, the substrate can be annealed at a predetermined temperature $T_r$ while the printed materials are cured. The annealing or recovery temperature is selected according to the type of polymer substrate. As the embossing is carried out on the substrate in its solid state, when the sample is annealed the substrate is recovered close to its original flat form again. By using this phenomenon, high resolution structures can be fabricated by inkjet deposition of materials into the embossed 3D indentations and devices can then be fabricated device with a substantially 2D structure after recovery of the substrate.

An embodiment of the present invention illustrating its basic principles is illustrated in FIG. 3. A plastic substrate 10 (shown in FIG. 3A), preferably formed of PEN [poly(ethylene naphthalate)], or PET [poly(ethylene terepthalate)] is mechanically embossed using a master 20 at a temperature $T_e$ which is much lower than its melting temperature (see FIG. 3B). The surface of the substrate can be treated before or after embossing, for example with an $O_2$ plasma treatment, in order to improve subsequent application of a SAM layer.

Figure 3A:
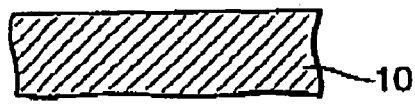
FIG. 3 shows a method of manufacturing a thin film transistor according to the present invention.
Figure 3B:
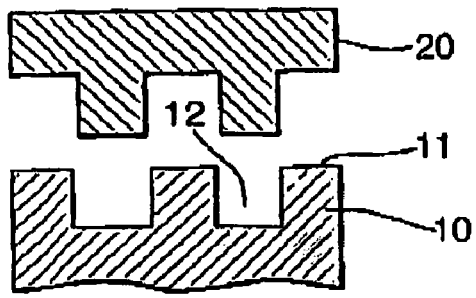
Figure 3C:
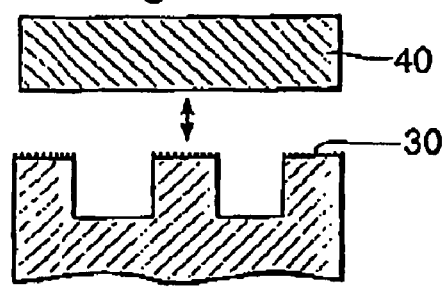

A SAM layer 30 is applied to the embossed, plasma-treated surface using an inked stump 40, which is preferably a flat block of rubber-like material such as PDMS, to produce a wetting contrast for the ink-jet deposition (see FIG. 3C). More specifically, the inked stump is pressed onto the surface of the embossed substrate. If the contrast ratio of the substrate is sufficiently high, the SAM 30 is applied only to the unembossed portions 11 of the surface (the SAM 30 being shown by the dotted lines in FIG. 3C) and is not applied to the indentations 12. If the contrast ratio is too low, the stump will contact the bottoms of the indentations and the SAM will be applied to the whole of the substrate.

Figure 3D:
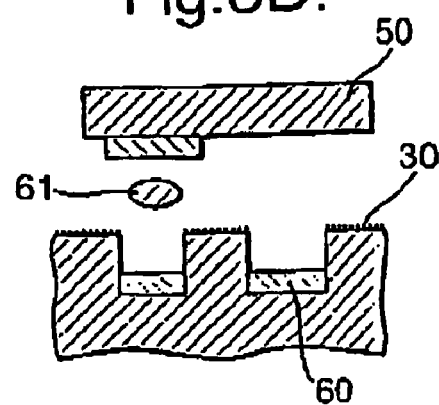
Figure 3E:

Next, droplets 65 of an solution of conductive material are deposited by an inkjet device 50 into the indentations 12 to define the source and drain electrodes 60 of transistors after drying (see FIG. 3D). Even in the event that the solution is accidentally deposited onto unembossed portions 11 of the surface of the substrate 10, the hydrophilic/lyophobic SAM coating 30 causes it to be repelled and thus to fall into the indentations 12. This allows a sufficient amount of the solution to be deposited for the bottom surface of the indentation 12 to be completely covered, without covering any unembossed surface 11 with the solution.

Figure 3F:
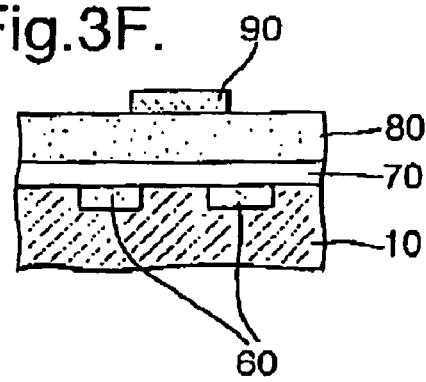

The substrate 10 is then annealed at a suitable predetermined temperature $T_r$. Recovery temperature $T_r$ should be selected to allow both the curing of printed materials and substrate recovery (see FIG. 3E). Preferably, after annealing the substrate has recovered sufficiently that the upper surface of the conductive material left after evaporation of the solution is substantially flush with the unembossed portions 11 of the surface of the substrate. To improve substrate recovery speed, recovery temperature $T_r$ is preferably selected to be higher than embossing temperature $T_e$. Next, the semiconductor and dielectric layers 70, 80 are deposited and the gate electrode 90 is finally printed to complete the TFT (FIG. 3F).

Many TFTs can be formed on a substrate in a single operation in this way. The TFTs may be connected in part by correctly patterning the indentations 11 and hence the electrodes to form a circuit. In addition, the TFTs can be connected in a circuit by depositing a conductive material between electrodes using an inkjet or other suitable method. Of course, electrical devices other than TFTs may be formed.

Figure 4:
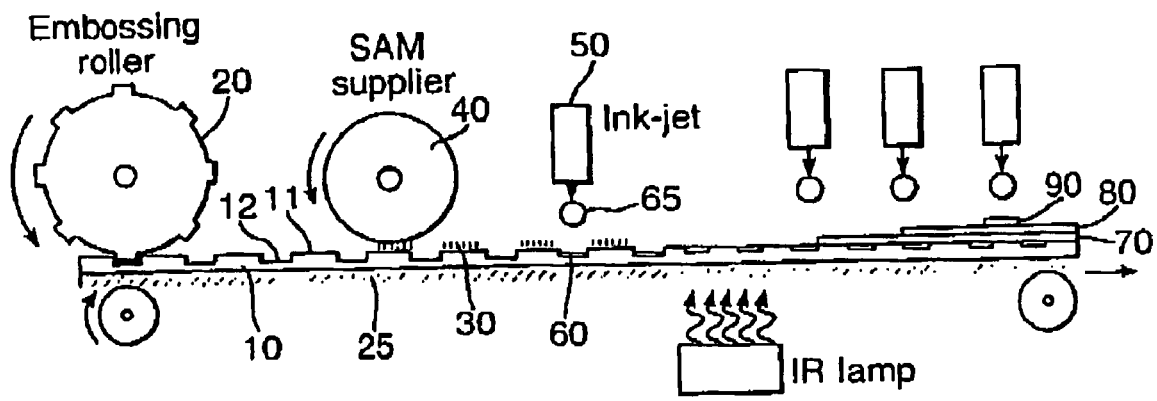
FIG. 4 is a schematic view of a possible method for mass-production of devices using the present invention in a roll-to-roll process.

FIG. 4 is a proposed method of mass production of devices using the present invention in a roll-to-roll process. In particular, the substrate is flexible and is stored on a roll (not shown) at the left end of the FIG. 4. The substrate is unrolled and is carried on a conveyor 25 at the embossing temperature $T_e$ passed the embossing master 20, which in this embodiment is shown in the form of a roller. Subsequently, the conveyor carries the substrate 10 to an inking station, where it is inked with a hydrophobic/lyophobic SAM solution using an inking roller 40. Next, the solution of conductive material is deposited in the indentations 12 before curing and annealing, for example using an infrared (IR) lamp. The semiconductor, insulator and gate electrode layers 70, 80, 90 are all then deposited and dried before the substrate is again stored on another roller (not shown) to the right of FIG. 4 or cut up for processing to form display or other devices. Such a manufacturing process is considerably faster and cheaper than inorganic transistor manufacturing processes and therefore is highly advantageous.

The above description is a simplified and general description of the present invention and many variations are possible. For example, the annealing process can be split into two stages. The first stage is to evaporate the solution of conductive material, thereby leaving only the conductive material that is to form the source and drain electrodes 60 of the resultant TFT. For example, the solution can be a PEDOT water suspension and after evaporation the electrodes are as shallow as 100 nm. After this initial curing stage, the substrate is heated to the recovery temperature $T_r$ to place the substrate with electrodes in a flat condition with substantially minimised topography.

The substrate need not be formed of a single material and may be formed of layers of two or more different materials. For example, the substrate can be formed of a lower layer having a high glass transition point $T_g$ and an upper layer having a lower glass transition point $T_g$. In that case, warping of the upper layer during embossing and recovery can be avoided since it is supported by the lower layer, which is less affected by the comparatively low embossing and annealing temperatures $T_e$ and $T_r$ required for the upper layer.

In a preferred embodiment, the substrate is coated with a substrate coating layer, preferably before embossing and other treatment, to improve the subsequent application of the SAM. The substrate coating layer may have various wettability properties depending the materials chosen. In most cases the sample surface (the surface of the coating layer) needs to be treated before SAM application.

Alternative deposition techniques for the materials of the substrate coating layer and of the semiconductor and dielectric layers 70, 80 include doctor blading, printing (eg screen printing, offset printing, flexo printing, pad printing, inkjet printing etc), evaporation, sputtering, chemical vapour deposition, spin-coating, dip and spray coating, electroless plating, and so forth.

Alternative ways of surface treating the substrate include corona discharge treatments, UV-ozone treatments, chemical reaction, coating, vacuum deposition etc. The surface treatment can be applied before or after embossing depending on the detailed process.

Alternative ways of surface treating the embossed structures include soft-conduct printing, plasma or chemical solution processes. Materials that can be used include fluorooligomers, fluoropolymers etc. with water- or oil-repelling functional groups. Unidyne™ is one example of a material that provides both a functional group for hydrophobicity and adhesion to the under layer.

The source, drain and gate conductive electrodes can be deposited by inkjet printing of conductive polymer solutions, and colloid suspensions of both organic and inorganic materials (such as metal Ag, Cu, Au, Ni etc The present invention can be used in both sheet-to-sheet and roll-to-roll fabrication processes, amongst others. The inkjet pool-drawing method, in which deposited ink flows into small features by using proper design of the prepatterned geometry and surface treatment, could be used for fabricating device structures with resolutions from submicron to 20 micron. For pool-drawing it has been found that the wetting contrast on the embossed surface may not be necessary, because the side walls of the indentations defined by embossing can effectively confine the liquid flow to achieve the high resolution mentioned above. However, in some instances it may be necessary to apply a surface treatment, such as plasma or uniform surface chemical treatment, for some materials before ink-jet printing.

Irrespective of how the solution is deposited, the substrate may comprise both a plastic layer or polymer film coated on a rigid layer (such as glass, wood or metal).

The material may be embossed in either a solid/glassy state, as discussed above, or a liquid state. Usually the polymer film carried on a substrate is in a solid state at room temperature. With liquid state embossing, the embossing can be done after heating the sample to a temperature suitable to melt the polymer so that is in a liquid state. The embossing tool can then be dipped in the liquid polymer. Then the system can be cooled to room temperature and the embossing tool released from the sample. This process is known as a thermal process.

Another method involves UV curing. This method can be carried out at room temperature. Specifically, with this method the material to be embossed is preferably in a liquid state at room temperature. The material in liquid state is coated on a substrate and the embossing tool dipped in it. A UV light is then irradiated onto the material, causing it to turn solid. A preferred mechanism for solidification is that original short molecule chains are polymerised into large chains by a photoreaction.

For liquid state embossing, a low viscosity of the material to be embossed is preferred. Preferably, embossing is done at a temperature 30~50° C. above material's melting point for.

Preferably, the annealing process for recovery of the substrate should be determined at least in part by the amount of material deposited in the indentations 12. When the deposited source-drain material is thick, and consequently almost fills the indentations 12, it may not be necessary to perform the annealing step. Similarly, if the performance requirements of the device are not very high, the annealing step may be neglected.

It is recognised that when the solution of the conductive material is evaporated the volume decreases. However, an advantage of the recovery step of the present invention is that a substantially flat topography can nonetheless be obtained.

In the embodiment shown in FIG. 3, the source and drain electrodes are formed in the indentations. However, it would also be possible to treat the unembossed portions 11 of the surface so that they are hydrophilic and to deposit the aqueous solution on these. Before or after annealing for substantial recovery of the substrate, the semiconducting material could be deposited in the indentations to form the channels, with other layers being deposited as required.

In addition, the substrate need not be treated to have hydrophobic portions. Instead, the SAM layer could be lyophobic and the conductive material provided in a non-aqueous solution, for example using an organic solvent. In addition, the conductive material need not be in the form of a solution. As an example, colloids of gold or silver could be used instead. Preferably, these would be annealed in a separate step to annealing the substrate.

EXAMPLE

A poly(ethylene naphthalate)(PEN), which has a work temperature of more than 200° C. (Tg~130° C.), was selected. To improve the capability of applying a SAM, a 100 nm cyclotene film was spin-coated onto the PEN substrate and the film was cured at 180° C. for 2 hours for polymerisation of the cyclotene. Embossing was performed by pressing a photolithographically defined Si mould onto the PEN substrate at 150° C. and about 25 Bar. The pressure was released after cooling the sample down to room temperature.

The sample was treated with $O_2$ plasma (gas flow: 200 ml/min, power: 150 watt) to further improve the capability of applying a SAM to create a hydrophobic top surface of the embossed structure while the voids of the structures remained hydrophilic. The SAM was applied by printing with a flat poly(dimethylsiloxane) (PDMS) stump that was inked with 1H, 1H, 2H, 2H-perfluorodecyl-trichlorosilane solution (~0.1 mol in hexane) on the structured substrate. A poly(3,4-ethylenedioxythiophene)-polystyrenesulphonic acid (PEDOT-PSS) water suspension was inkjet printed in the voids to define the source-drain electrodes. In this process the highly hydrophobic SAM layer effectively separated the printed droplets to improve the printing resolution.

Next, the sample was thermo-annealed at 170° C. for 5 min to recover the substrate. Polyarylamine (PAA), polythiophene, or poly 3-hexylthiophene(P3HT) was selected as the semiconductor layer, while poly(4-vinylphenol) (PVP) or poly(4-methyl-1-pentene) (PMP) was chosen as the dielectric layer. Typical layer thicknesses are 20~100 nm for semiconductors and 500~2000 nm for dielectrics which were adjusted by solvent concentration (10~200 grams/liter) and speed of spin-coating(1000~5000 r/min). Finally PEDOT-PSS was printed as the gate electrode.

Figure 5:
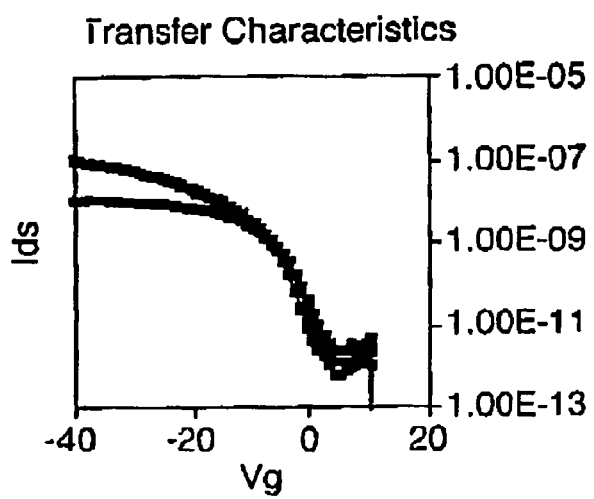
FIG. 5 shows transfer characteristics of a TFT fabricated in accordance with the present invention.

FIG. 5 shows transfer characteristics of a TFT that was fabricated by this process. The dependence of source-drain current (Ids) on gate voltage (Vg) was measured with source-drain voltages ($V_{sd}$) of −5V and −40V respectively.

The present invention provides a gateway for fabricating commercial electronic devices and circuits of high resolution with high reliability and at low cost. The present invention is particularly suitable for the manufacture of TFTs which can then be connected using inkjet printing to form the required circuitry for devices such as display devices. However, it is also suitable for the manufacture of other sorts of electronic device, connectable as described above.

Figure 6:
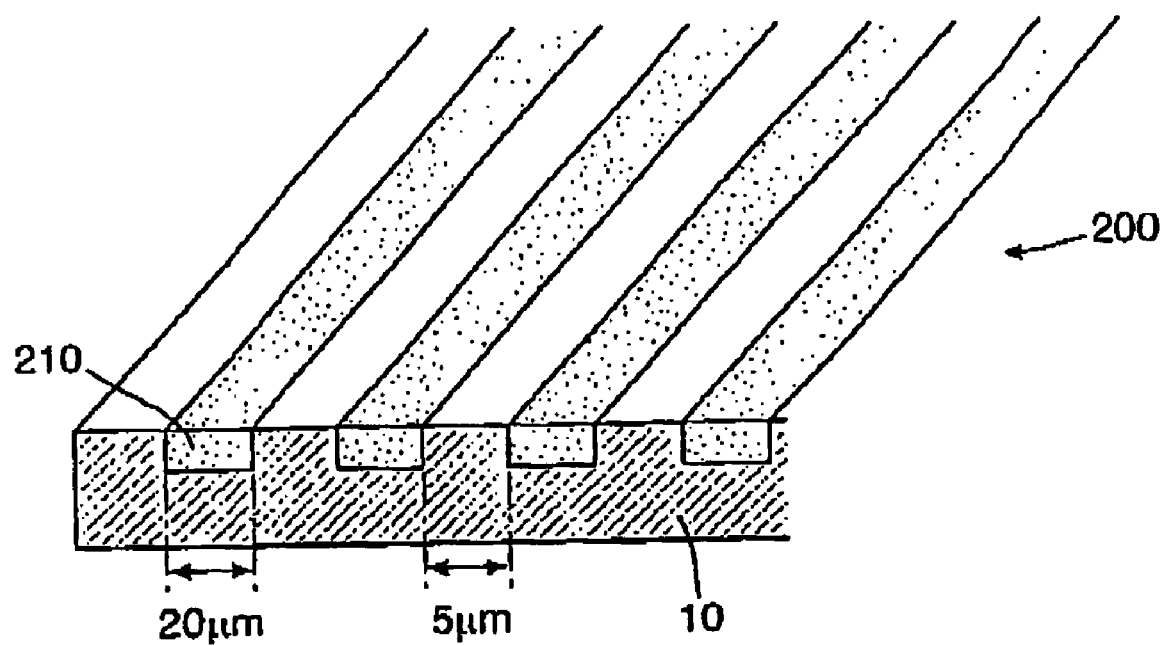
FIG. 6 shows a step of forming an FeRAM in accordance with the present invention.

For example, the present invention could be used to fabricate a ferroelectric random access memory (FeRAM). In particular, FIG. 6 shows a substrate 200 at an equivalent stage of processing as FIG. 3E. As shown in FIG. 6, the substrate 200 has indentations 12 in the form of long trenches, so that electrode strips 210 are formed. Subsequently, the substrate 200 is spun-coated with a solution of ferroelectric material. Finally, another substrate 210 is disposed on the first substrate 210 with the ferroelectric material between them, so that the respective electrode strips 210 are at an angle to one another. Each intersection between electrode strips on the respective substrates forms a ferroelectric memory cell that can be addressed and thus written and read to.

It should be understood that in this specification, the term solution is intended to include colloids and suspensions, such as a PEDOT-PSS water suspension.

The foregoing description has been given by way of example only and it will be appreciated by a person skilled in the art that modifications can be made without departing from the scope of the present invention.

The invention claimed is:

1. A method of forming an electronic device on a substrate, comprising:
   embossing the substrate;
   depositing a solution of a first material in indentations on the substrate formed by the embossing;
   evaporating the solution of the first material, the first material being provided in the indentations; and
   annealing the substrate.

2. A method according to claim 1, further comprising, after embossing the substrate, surface treating the substrate so that unindented portions repel the solution of the first material.

3. A method according to claim 2, wherein
   the unindented portions are surface treated to be hydrophilic or hydrophobic.

4. A method according to claim 2, wherein the solution is an aqueous or organic solution and the unindented portions are surface treated to be hydrophobic or lyophobic respectively.

5. A method according to claim 2, wherein the surface treating comprises applying a self-assembled monolayer to unindented portions of the substrate.

6. A method according to claim 5, wherein the self-assembled monolayer is applied using a solution of 1H, 1H, 2H, 2H-perfluorodecyl-trichlorosilane.

7. A method according to claim 2, wherein the surface treating is performed using an inked, substantially flat stump.

8. A method according to claim 2, further comprising additionally surface treating the substrate before or after embossing the substrate.

9. A method according to claim 8, wherein the additional surface treating comprises $O_2$ plasma treatment.

10. A method according to claim 8, wherein the additional further treating comprises providing a thin film on the substrate.

11. A method according claim 1, wherein the substrate is a multilayered substrate.

12. A method according to claim 11, wherein the multilayered substrate includes a polymer layer, which is embossed, carried on a second layer having a higher glass transition point than the polymer layer.

13. A method according to claim 1, wherein the substrate comprises at least one of poly(ethylene naphthalate) [PEN], poly(ethylene terepthalate) [PET], polycarbonate [PC], polyethersulphone[PES], and polyetheretherketon[PEKK].

14. A method according to claim 1, wherein the substrate is embossed at a predetermined temperature that is lower than the melting point of the substrate and at a predetermined pressure.

15. A method according to claim 14, wherein the substrate is cooled before the solution of the first material is deposited.

16. A method according to claim 1, wherein the solution of the first material is deposited by ink-jet printing.

17. A method according to claim 1, wherein the first material is an electrically conductive material.

18. A method according to claim 17, wherein the solution is a PEDOT-PSS water suspension or a colloid.

19. A method according to claim 17, further comprising the step of depositing further materials to complete the device.

20. A method according to claim 19, wherein the step of depositing comprises depositing a semiconductor layer, a dielectric layer and electrically conductive layer.

21. A method according to claim 20, wherein the device is a thin film transistor.

22. A method according to claim 1, wherein the first material is an electrically conductive material, and further comprising the step of depositing a layer of ferroelectric material and of providing a plurality of electrodes over the layer of ferroelectric material to form an FeRAM device.

23. A method according to claim 1 wherein the first solution is deposited by pool-drawing.

24. A method according to claim 23, further comprising performing a plasma or uniform surface chemical treatment to the substrate before depositing the first material by ink jet.

25. A method according to claim 1, wherein the substrate comprises both a plastic layer and a rigid layer coated with a polymer.

26. A method according to claim 25, wherein the material is embossed in a liquid state.

27. A method according to claim 26, further comprising thermal or UV curing.

28. A method according to claim 1, the substrate including an unindented portion, a surface of the unindented portion being apart from a surface of one of the indentations by a first distance, the annealing of the substrate including annealing the substrate such that the first distance is reduced.

29. A method of forming a device, the method comprising:
   forming a first indent portion, a second indent portion and an unindented portion in a substrate by embossing the substrate, the unindented portion being positioned between the first indent portion and the second indent portion, a surface of the first indent portion being apart from a surface of the unindented portion by a first distance;
   depositing a solution of a material on the first indent portion and the second indent portion; and
   annealing the substrate such that the first distance is reduced.

30. The method of forming the device according to claim 29, the method further comprising:
applying a surface treatment on the substrate before the forming of the first indent portion and the second indent portion.

31. The method of forming the device according to claim 29, the method further comprising:

forming a semiconductor film on the substrate after the annealing of the substrate;

forming an insulating film on the semiconductor film; and forming an electrode on the insulating film.

* * * * *